(12) United States Patent
Hsieh et al.

(10) Patent No.: US 9,613,708 B1
(45) Date of Patent: Apr. 4, 2017

(54) DATA STORAGE DEVICE AND DATA MAINTENANCE METHOD

(71) Applicant: Silicon Motion, Inc., Jhubei (TW)

(72) Inventors: Cheng-Yi Hsieh, Puxin Township (TW); Ming-Yen Lin, Taipei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/001,886

(22) Filed: Jan. 20, 2016

(30) Foreign Application Priority Data

Oct. 7, 2015 (TW) .............................. 104132975 A (51) Int. Cl.
| | | |
|---|---|---|
| G11C 16/04 | (2006.01) | |
| G11C 16/26 | (2006.01) | |
| G11C 16/10 | (2006.01) | |
| G06F 3/06 | (2006.01) | |

(52) U.S. Cl.
CPC ............ *G11C 16/26* (2013.01); *G06F 3/0619* (2013.01); *G06F 3/0655* (2013.01); *G06F 3/0679* (2013.01); *G11C 16/10* (2013.01)

(58) Field of Classification Search
CPC ...................................................... G11C 16/04
USPC ..................................................... 365/185.09
See application file for complete search history.

(56) References Cited

U.S. PATENT DOCUMENTS

| | | | | |
|---|---|---|---|---|
| 9,159,441 | B2 * | 10/2015 | Kim ..................... | G11C 16/26 |
| 9,165,670 | B2 * | 10/2015 | Mekhanik .......... | G11C 16/3427 |
| 9,367,417 | B2 * | 6/2016 | Jung ..................... | G11C 8/14 |
| 2009/0185421 | A1 | 7/2009 | Yun et al. | |
| 2015/0117100 | A1 * | 4/2015 | Park ..................... | G11C 16/10 |
| | | | | 365/185.03 |
| 2015/0135039 | A1 * | 5/2015 | Mekhanik ........... | G06F 11/1072 |
| | | | | 714/773 |
| 2015/0234609 | A1 | 8/2015 | Yang | |

FOREIGN PATENT DOCUMENTS

| | | |
|---|---|---|
| TW | I312464 | 7/2009 |
| TW | I478170 | 3/2015 |

OTHER PUBLICATIONS

Taiwanese Office Action of corresponding TW application, published on Aug. 29, 2016.

* cited by examiner

*Primary Examiner* — Son Mai
(74) *Attorney, Agent, or Firm* — Wang Law Firm, Inc.

(57) ABSTRACT

A data storage device including a flash memory and a controller. The flash memory includes a plurality of pages and a plurality of word lines, wherein each of the word lines controls at least two of the pages. The controller reads a first page of the pages in response to a read command, wherein the first page is controlled by a first word line of the word lines, and the controller further writes dummy data into the pages controlled by the first word line other than the first page when a predetermined condition is satisfied, wherein the predetermined condition includes that the first word line is not close.

8 Claims, 7 Drawing Sheets

DATA STORAGE DEVICE AND DATA MAINTENANCE METHOD

CROSS REFERENCE TO RELATED APPLICATIONS

This Application claims priority of Taiwan Patent Application No. 104132975, filed on Oct. 7, 2015, the entirety of which is incorporated by reference herein.

BACKGROUND OF THE INVENTION

Field of the Invention

The present invention relates to a data maintenance method, and in particular to a data maintenance method related to data reading.

Description of the Related Art

Flash memory is considered a non-volatile data-storage device that uses electrical methods to erase and program itself. NAND Flash, for example, is often used in memory cards, USB flash devices, solid state devices, eMMCs, and other memory devices.

Flash memory such as NAND Flash uses a multiple-block structure to store data, wherein the flash memory uses floating gate transistors. The floating gates of the floating gate transistor may catch electronic charges for storing data. However, the floating gates may lose their electronic charges due to various operations and the various environmental parameters of the flash memory, which can lead to the problem of data retention.

BRIEF SUMMARY OF THE INVENTION

A detailed description is given in the following embodiments with reference to the accompanying drawings.

An exemplary embodiment provides a data storage device including a flash memory and a controller. The flash memory includes a plurality of pages and a plurality of word lines, wherein each of the word lines controls at least two of the pages. The controller reads a first page of the pages in response to a read command, wherein the first page is controlled by a first word line of the word lines, and the controller further writes dummy data into the pages controlled by the first word line other than the first page when a predetermined condition is satisfied, wherein the predetermined condition comprises that the first word line is not close.

Another exemplary embodiment provides a data maintenance method applied to a data storage device having a flash memory, wherein the flash memory comprises a plurality of pages and a plurality of word lines, and each of the word lines controls at least two of the pages. The data maintenance method includes: receiving a read command, wherein the read command indicates reading a first page of the pages, and the first page is controlled by a first word line of the word lines; and writing dummy data into the pages controlled by the first word line other than the first page when a predetermined condition is satisfied, wherein the predetermined condition comprises that the first word line is not close.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
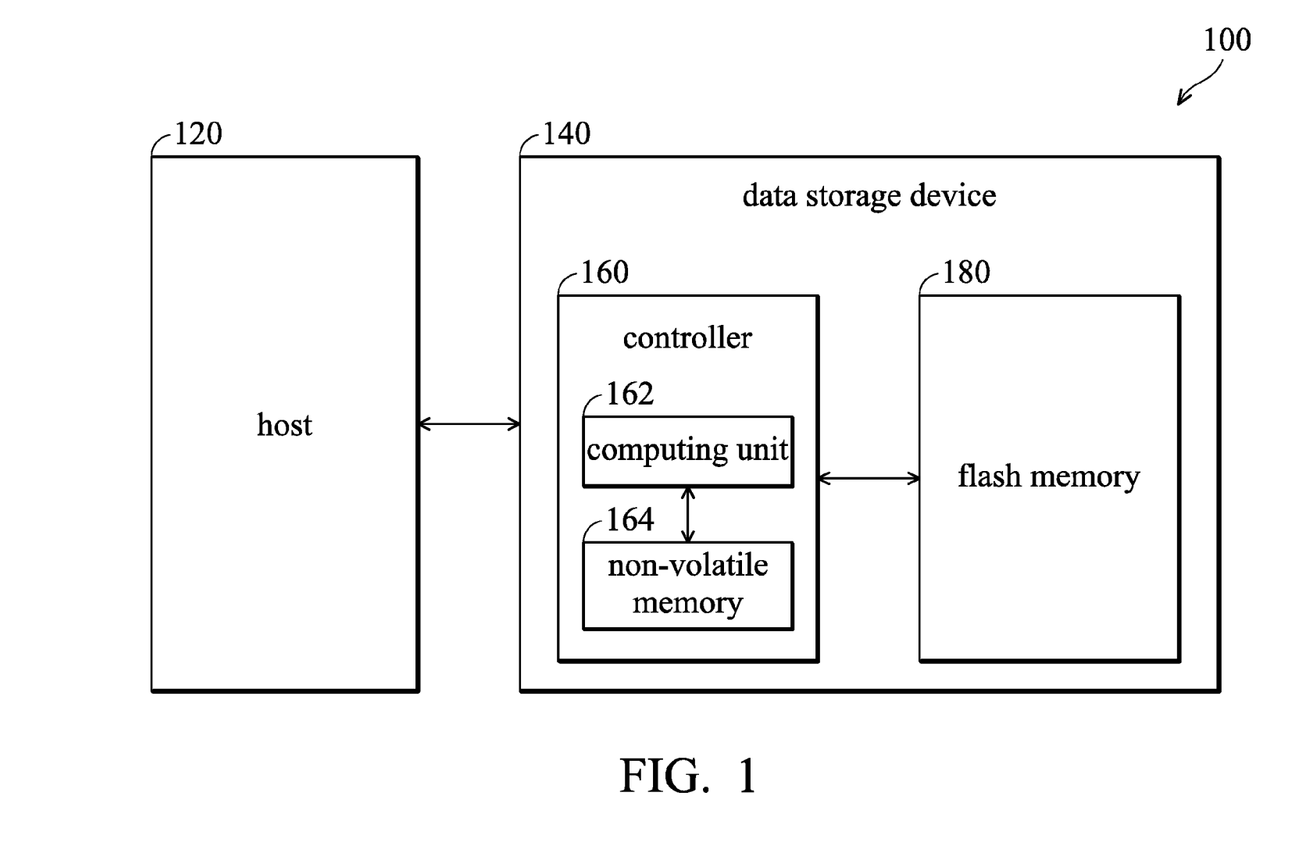
FIG. 1 is a schematic diagram illustrating an electronic system, constructed in accordance with some embodiments.

FIG. 1 is a schematic diagram illustrating an electronic system, constructed in accordance with some embodiments. The electronic system 100 includes a host 120 and a data storage device 140. The data storage device 140 includes a flash memory 180 and a controller 160, and operates in response to the commands of the host 120.

The controller 160 includes a computing unit 162 and a non-volatile memory 164 (ROM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. Moreover, the computing unit 162 further includes an error correction engine (not shown). The error correction engine is arranged to perform error correction (ECC) on the retrieved data to correct the retrieved data when the retrieved data is wrong, but it is not limited thereto. It should be noted that, in one of the embodiments, the non-volatile memory 164 includes software or firmware arranged to enable the computing unit 162 to encode the user data arranged to be stored in the pages into parity code(s). Furthermore, the software or firmware stored in the non-volatile memory 164 are also configured to enable the computing unit 162 to encode the parity codes of the user data stored in some pages into advanced parity code(s) of the parity codes. When the retrieved data has at least one error bit, the controller 160 performs error correction on the retrieved data by using the parity codes or the advanced parity codes to correct the error bit and successfully read the pages. Moreover, the controller 160 further repeatedly reads the pages with error bits by using a read-retry table. More specifically, the read-retry table can be stored in the flash memory 180 or the non-volatile memory 164, and the read-retry table includes a plurality of different read voltages. When the controller 160 cannot use the default read voltage to successfully read a target page, the controller 160 can repeatedly reads the target page by using the different read voltages stored in the read-retry table to obtain the correct data of the target page.

The flash memory 180 includes a plurality of blocks, each of the blocks has a plurality of pages. Moreover, the flash memory 180 further includes a plurality word lines that are arranged in sequence and adjacent to each other, and a plurality of bit lines that are arranged in sequence and adjacent to each other, wherein each of the word lines controls at least one page for selecting the target page. For example, each of the word lines controls a page when the flash memory 180 operates as the Single-Level Cell (SLC). when the flash memory 180 operates as the Multi-Level Cell (MLC), each of the word lines controls two pages which are a strong page LSB and a weak page MSB. When the flash memory 180 operates as the Triple-Level Cell (TLC), each of the word lines control three pages which are a strong page LSB, a middle page CSB and a weak page MSB, but it is not limited thereto. More specifically, when the flash memory 180 operates as the Multi-Level Cell, the page controlled by a word line of the flash memory 180 can be programmed into a strong page LSB and a weak page MSB. When the flash memory 180 operates as the Triple-Level Cell, the page controlled by a word line of the flash memory 180 can be programmed into a strong page LSB, a middle page CSB and a weak page MSB.

It should be noted that when the word line is not close (open), the pages controlled by the un-closed word line have more probability to have more error bits than the pages controlled by the closed word line. Namely, when at least one of the pages controlled by a specific word line is not written by any valid data and at least one of the pages controlled by the specific word line have been written by valid data, the page with valid data is not stable and has higher error bits. Therefore, the data maintenance method and the data storage device 140 of embodiments are arranged to close the un-closed word line to reduce the error bits.

More specifically, the controller 160 reads a first page of the pages in response to a read command, wherein the first page is controlled by a first word line of the word lines. When the first word line is not closed, the controller 160 writes dummy data into the page(s) controlled by the first word line other than the first page, wherein the dummy data can be a predetermined invalid data or a random data. Next, the controller 160 re-read the first page after the dummy data is written in the pages controlled by the first word line other than the first page. When the first page is successfully read, the controller 160 transmits the data obtained by successfully read the first page to the host 120 according to the read command. In one embodiment, the controller 160 is configured to perform the step of writing the dummy data into the pages controlled by the first word line other than the first page when the first page cannot be successfully read. For example, the controller 160 is configured to repeatedly read the first page according to the read voltages of the read-retry table when the default read voltage cannot successfully read the first page, and write the dummy data into the pages controlled by the first word line other than the first page when all of the read voltages cannot successfully read the first page.

Figure 2:
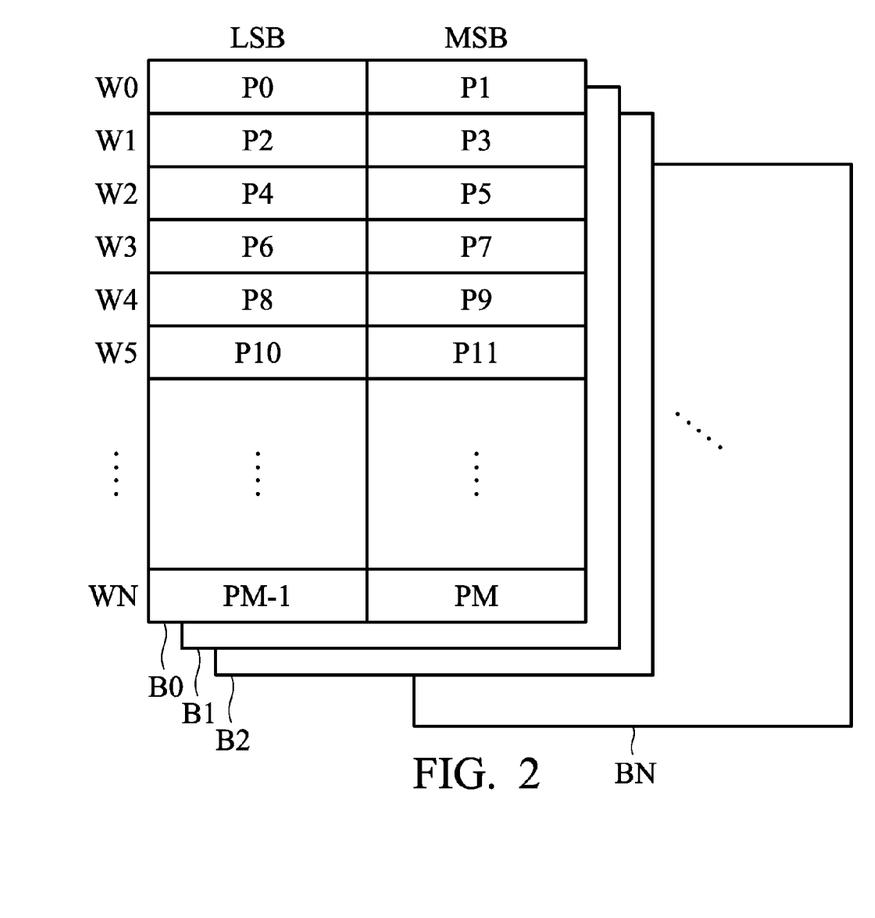
FIG. 2 is a schematic diagram illustrating a flash memory, constructed in accordance with some embodiments.

FIG. 2 is a schematic diagram illustrating a flash memory, constructed in accordance with some embodiments. The flash memory 180 of FIG. 2 operates as the Multi-Level Cell. In this embodiment, the flash memory 180 includes a plurality of blocks B0~BN, and each of the blocks has a plurality of pages P0~PM, wherein the middle pages P0、P2、P4 . . . PM−1 are strong pages LSB, and the pages P1、P3、P5 . . . PM are weak pages MSB. It should be noted that the pages controlled by the same word line may not have continuous addresses. For example, when data is written into the pages P0~P4 of the block B0 sequentially and the pages P5~PM of the block B0 have not been written (programmed), the word lines W0~W1 are closed and the word lines W2~WN are un-closed (open). When the controller 160 cannot successfully read the page P4 controlled by the un-closed word line W2 according to the read command, the controller 160 writes dummy data into the page P5 controlled by the word line W2 other than the page P4 to close the word line W2. After the controller 160 writes the dummy data into the page P5 controlled by the word line W2, the controller 160 re-reads the page P4 of the word line W2, and transmits the data read from the page P4 to the host 120 when the page P4 is successfully read. In another embodiment, when the controller 160 cannot read the page P4 by using the default read voltage before the word line W2 is close, the controller 160 is further configured to repeatedly read the page P4 by using the read voltages of the read-retry table. When all of the read voltages of the read-retry table cannot successfully read the page P4, the controller 160 writes dummy data into the page P5 controlled by the word line W2 other than the page P4 to close the word line W2. After the word line W2 is closed, the controller 160 reads the page P4 by using the default read voltage. When the page P4 still cannot be successfully read after the word line W2 is closed, the controller 160 can also repeatedly read the page P4 controlled by the closed word line W2 according to the read voltages of the read-retry table. When the controller 160 successfully reads the page P4, the controller transmits the data successfully read from the page P4 to the host 120. When the controller 160 cannot successfully read the page P4 controlled by the closed word line W2 by using the read voltages of the read-retry table, the controller 160 marks the page P4 as a bad page or mark the block B0 included the page P4 as a bad block. In one embodiment, the controller 160 stops to write data into the block B0 after the dummy data is written into the page P5 of the block B0. Namely, although the pages P6~PM of the block B0 do not have any valid data or dummy data, the controller 160 will not select the block B0 to write data into the pages P6~PM after the dummy data is written into the page P5 of the block B0.

Figure 3:
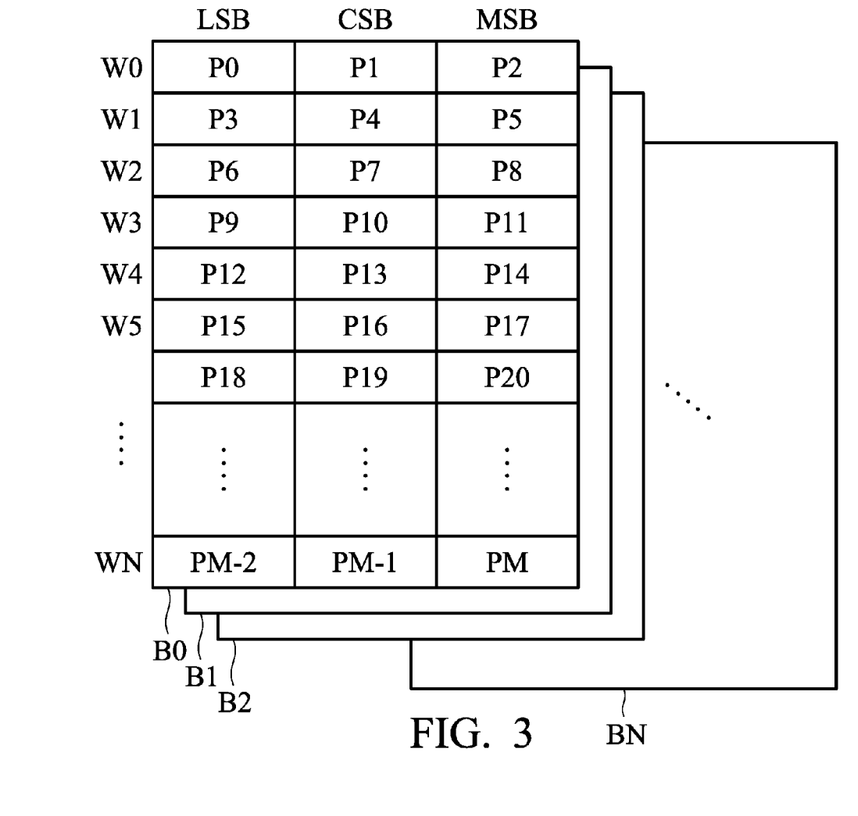
FIG. 3 is a schematic diagram illustrating another flash memory, constructed in accordance with some embodiments.

FIG. 3 is a schematic diagram illustrating another flash memory, constructed in accordance with some embodiments. The flash memory 180 of FIG. 3 operates as the Triple-Level Cell (TLC). In this embodiment, the flash memory 180 includes a plurality of blocks B0~BN, and each of the blocks B0~BN has a plurality of pages P0~PM, wherein the middle pages P0, P3, P6 . . . PM−2 are strong pages LSB, the pages P1, P4, P7 . . . PM−1 are middle pages CSB, and the pages P2, P5, P8 . . . PM are weak pages MSB. Similarly, the pages controlled by the same word line may not have continuous addresses. For example, when data is written into the pages P0~P9 of the block B0 sequentially and the pages P10~PM of the block B0 have not been written (programmed), the word lines W0~W2 are closed and the word lines W3~WN are un-closed (open). When the controller 160 cannot successfully read the page P9 controlled by the un-closed word line W3 according to the read command, the controller 160 writes dummy data into the page P10 and page P11 controlled by the word line W3 other than the page P9 to close the word line W3. After the controller 160 writes the dummy data into the page P10 and page P11 controlled by the word line W3, the controller 160 re-reads the page P9 of the word line W3, and transmits the data read from the page P9 to the host 120 when the page P9 is successfully read. In another embodiment, when the controller 160 cannot read the page P9 by using the default read voltage before the word line W3 is close, the controller 160 is further configured to repeatedly read the page P9 by using the read voltages of the read-retry table. When all of the read voltages of the read-retry table cannot successfully read the page P9, the controller 160 writes dummy data into the page P10 and page P11 controlled by the word line W3 other than the page P9 to close the word line W3. After the word line W3 is closed, the controller 160 reads the page P9 by using the default read voltage. When the page P9 still cannot be successfully read after the word line W3 is closed, the controller 160 can also repeatedly read the page P9 controlled by the closed word line W3 according to the read voltages of the read-retry table. When the controller 160 successfully reads the page P9, the controller transmits the data successfully read from the page P9 to the host 120. When the controller 160 cannot successfully read the page P9 controlled by the closed word line W3 by using the read voltages of the read-retry table, the controller 160 marks the page P9 as a bad page or marks the block B0 included the page P9 as a bad block. In one embodiment, the controller 160 stops to write data into the block B0 after the dummy data is written into the page P10 and the page P11 of the block B0. Namely, although the pages P12~PM of the block B0 do not have any valid data or dummy data, the controller 160 will not select the block B0 to write data into the pages P12~PM after the dummy data is written into the page P10 and the page P11 of the block B0.

In another embodiment, for example, when data is written into the pages P0~P7 of the block B0 sequentially and the pages P8~PM of the block B0 have not been written (programed), the word lines W0~W1 are closed and the word lines W2~WN are un-closed (open). When the controller 160 cannot successfully read the page P6 controlled by the un-closed word line W2 according to the read command, the controller 160 writes dummy data into the page P8 controlled by the word line W2 other than the pages P6 and P7 to close the word line W2. After the controller 160 writes the dummy data into the page P8 controlled by the word line W2, the controller 160 re-reads the page P6 of the word line W2, and transmits the data read from the page P6 to the host 120 when the page P6 is successfully read. In another embodiment, when the controller 160 cannot read the page P6 by using the default read voltage before the word line W2 is close, the controller 160 is further configured to repeatedly read the page P6 by using the read voltages of the read-retry table. When all of the read voltages of the read-retry table cannot successfully read the page P6, the controller 160 writes dummy data into the page P8 controlled by the word line W2 other than the pages P6 and P7 to close the word line W2. After the word line W2 is closed, the controller 160 reads the page P6 by using the default read voltage. When the page P6 still cannot be successfully read after the word line W2 is closed, the controller 160 can also repeatedly read the page P6 controlled by the closed word line W2 according to the read voltages of the read-retry table. When the controller 160 successfully reads the page P6, the controller transmits the data successfully read from the page P6 to the host 120. When the controller 160 cannot successfully read the page P6 controlled by the closed word line W2 by using the read voltages of the read-retry table, the controller 160 marks page P6 as a bad page or mark the block B0 included the page P6 as a bad block. In one embodiment, the controller 160 stops to write data into the block B0 after the dummy data is written into the page P8 of the block B0. Namely, although the pages P9~PM of the block B0 do not have any valid data or dummy data, the controller 160 will not select the block B0 to write data into the pages P9~PM after the dummy data is written into the page P8 of the block B0.

Figure 4:
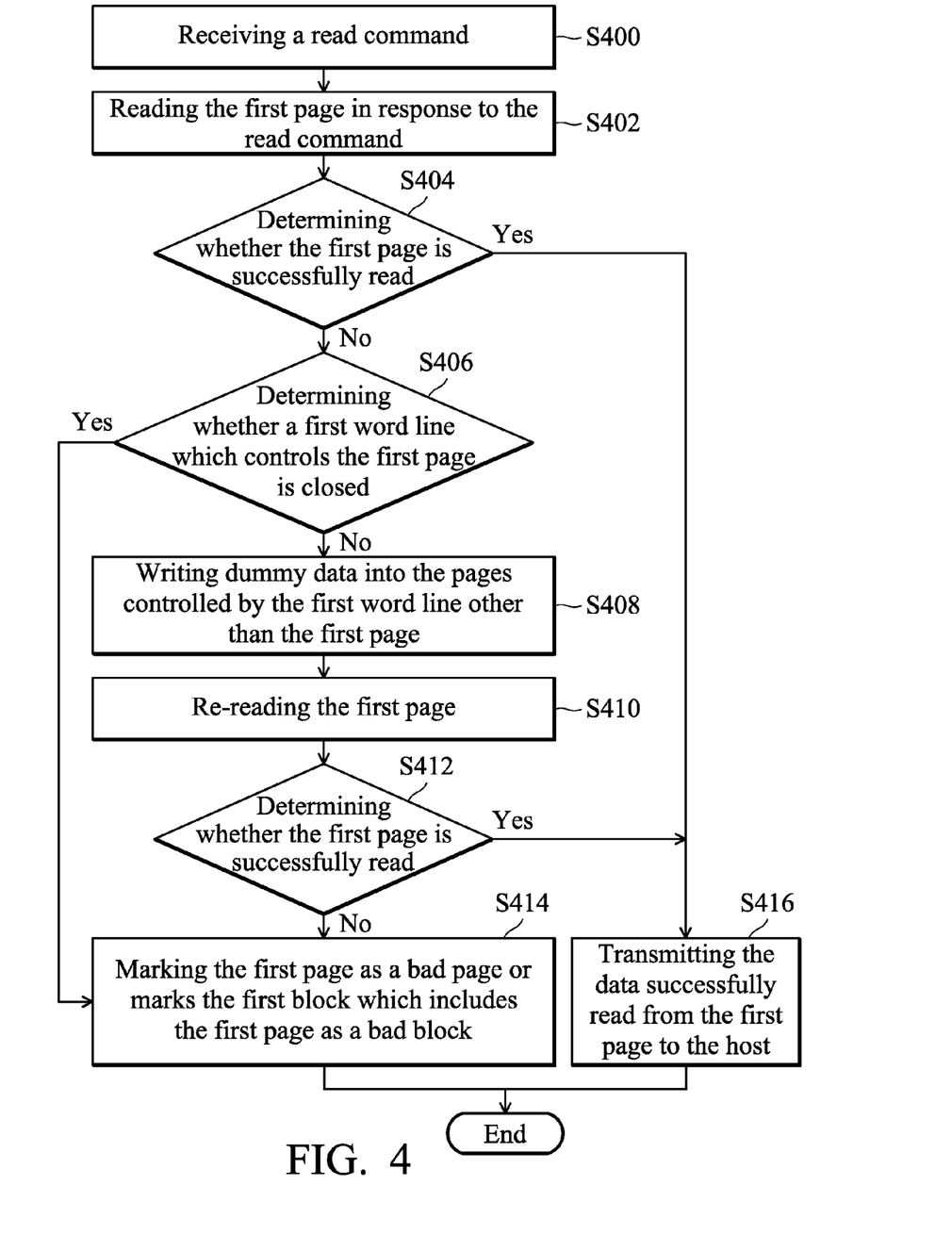
FIG. 4 is a flowchart of a data maintenance method constructed in accordance with some embodiments.

FIG. 4 is a flowchart of a data maintenance method constructed in accordance with some embodiments. The data maintenance method is applied to the data storage device 140 of FIG. 1. The process stars at step S400.

In step S400, the controller 160 receives a read command from the host 120, wherein the read command indicates reading a first page of the flash memory 180.

Next, in step S402, the controller 160 reads the first page in response to the read command.

Next, in step S404, controller 160 determines whether the first page is successfully read. Namely, the controller 160 determines whether the first page is successfully read according to whether the data retrieved from the first page has error bits and whether the error bits of the first page can be corrected by the error correction using the parity codes. When the first page does not have error bits, the controller 160 determines that the first page is successfully read. When the first page is successfully read, the process goes to step S416, otherwise, the process goes to step S406.

In step S406, the controller 160 determines whether a first word line which controls the first page is closed. When the first word line is closed, the process goes to step S414, otherwise, the process goes to step S408.

Next, in step S408, the controller 160 writes dummy data into the pages controlled by the first word line other than the first page to close the first word line.

Next, in step S410, the controller 160 re-reads the first page.

Next, in step S412, the controller 160 determines whether the first page is successfully read. Namely, the controller 160 determines whether the first page is successfully read according to whether the data retrieved from the first page has error bits and whether the error bits of the first page can be corrected by the error correction using the parity codes. When the first page does not have error bits, the controller 160 determines that the first page is successfully read. When the first page is successfully read, the process goes to step S416, otherwise, the process goes to step S414.

In step S414, the controller 160 marks the first page as a bad page or marks the first block which includes the first page as a bad block. In one embodiment, the controller 160 can also abandon the data of the first page and move the other data of the block which includes the first page to another block. The process ends at step S414.

In step S416, the controller 160 transmits the data successfully read from the first page in the step S400 to the host 120 according to the read command. The process ends at step S416.

Figure 5A:
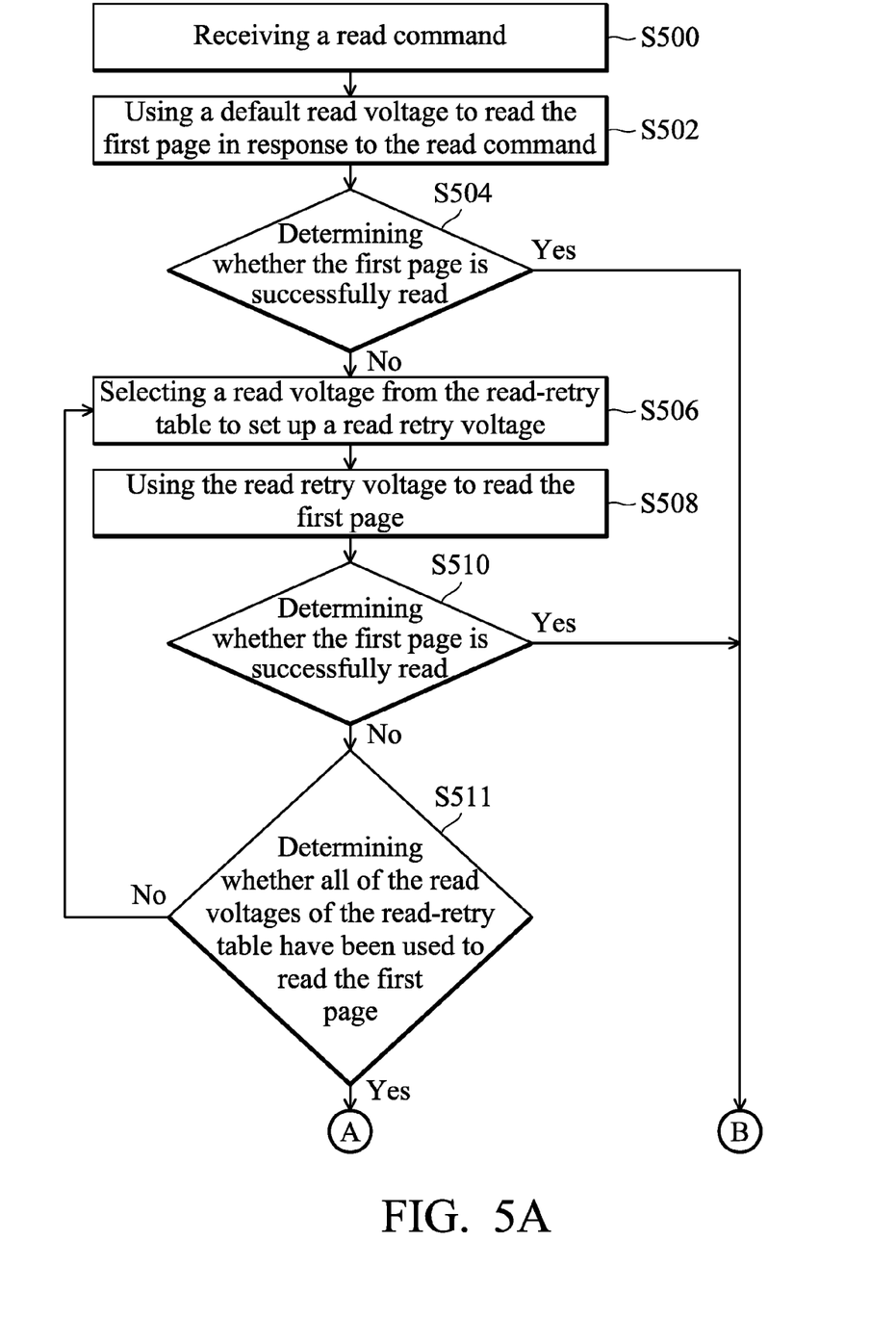
FIG. 5A~5C is a flowchart of another data maintenance method constructed in accordance with some embodiments.
Figure 5B:
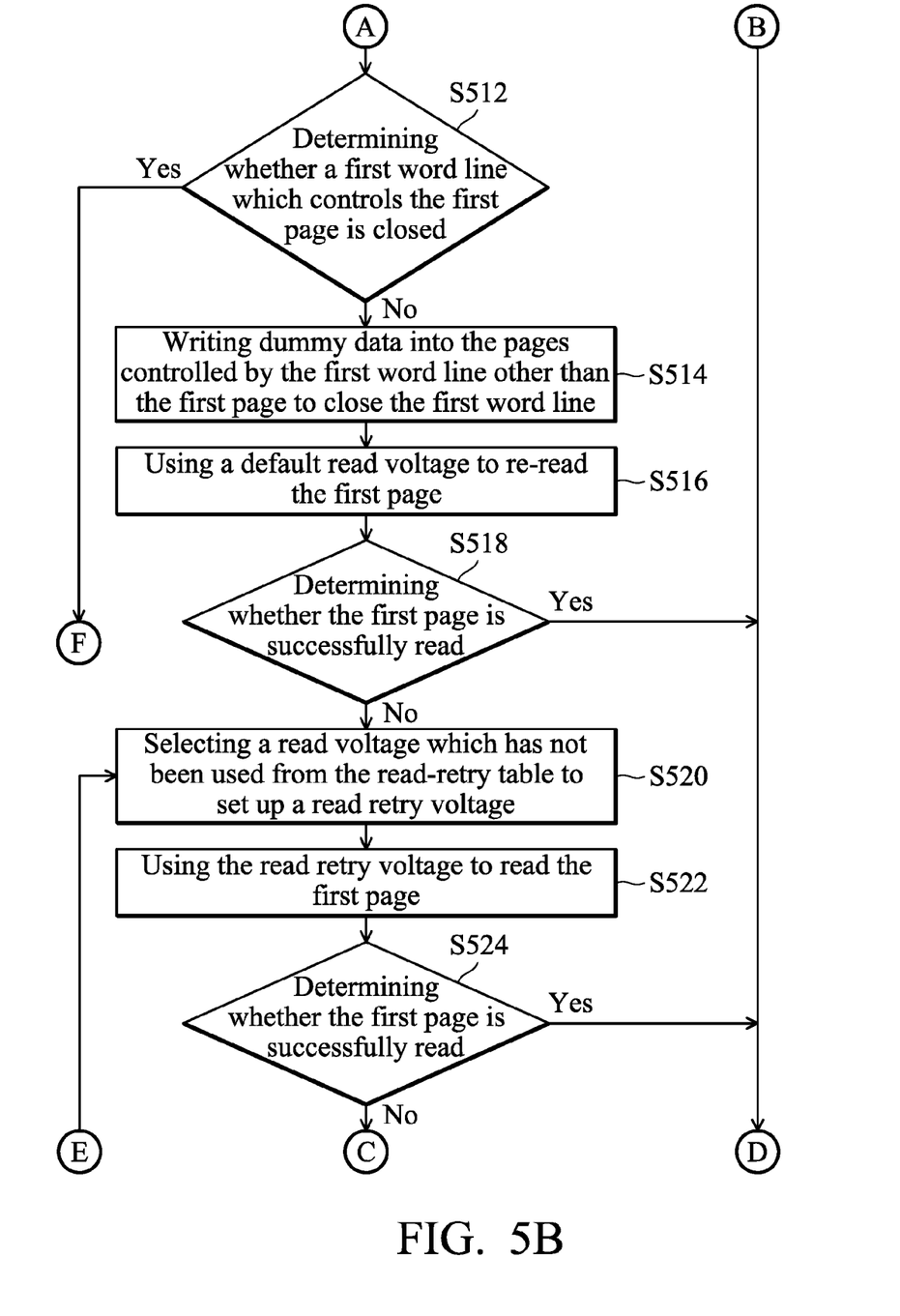
Figure 5C:
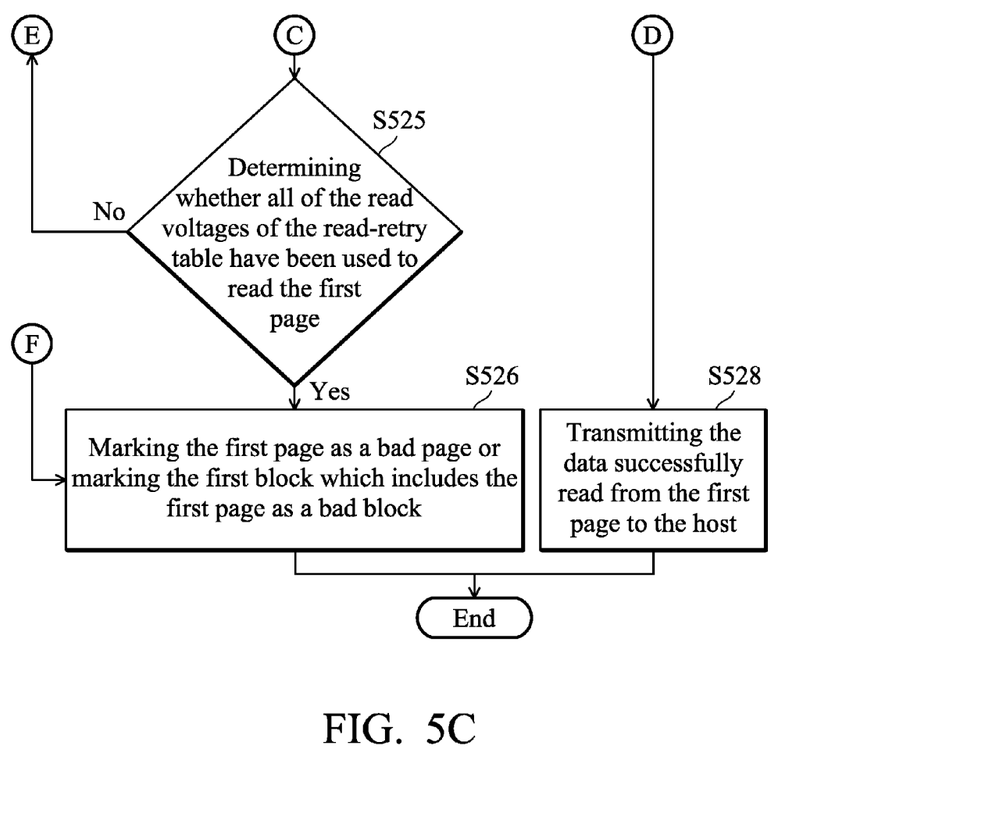

FIG. 5A-5C is a flowchart of another data maintenance method constructed in accordance with some embodiments. The data maintenance method is applied to the data storage device 140 of FIG. 1. The process starts at step S500.

In step S500, the controller 160 receives a read command from the host 120, wherein the read command indicates reading a first page of the flash memory 180.

Next, in step S502, the controller 160 uses a default read voltage to read the first page in response to the read command.

Next, in step S504, the controller 160 determines whether the first page is successfully read. Namely, the controller 160 determines whether the first page is successfully read according to whether the data retrieved from the first page has error bits and whether the error bits of the first page can be corrected by the error correction using the parity codes. When the first page does not have error bits, the controller 160 determines that the first page is successfully read. When the first page is successfully read, the process goes to step S52, otherwise, the process goes to step S506.

Next, in step S506, the controller 160 selects a read voltage which has not been used from the read-retry table to set up a read retry voltage.

Next, in step S508, the controller 160 uses the read retry voltage set up in step S506 to read the first page.

Next, in step S510, the controller 160 determines whether the first page is successfully read. Namely, the controller 160 determines whether the first page is successfully read according to whether the data retrieved from the first page has error bits and whether the error bits of the first page can be corrected by the error correction using the parity codes. When the first page does not have error bits, the controller 160 determines that the first page is successfully read. When the first page is successfully read, the process goes to step S528, otherwise, the process goes to step S511.

In step S511, the controller 160 determines whether all of the read voltages of the read-retry table have been used to read the first page. When all of the read voltages of the read-retry table have been used to read the first page, the process goes to step S512, otherwise, the process returns to step S506, the controller 160 continues to select another un-used read voltage to set up the read retry voltage.

In step S512, the controller 160 determines whether a first word line which controls the first page is closed. When the first word line is closed, the process goes to step S526, otherwise, the process goes to step S514.

Next, in step S514, the controller 160 writes dummy data into the pages controlled by the first word line other than the first page to close the first word line.

Next, in step S516, the controller 160 uses a default read voltage to re-read the first page.

Next, in step S518, the controller 160 determines whether the first page is successfully read. Namely, the controller 160 determines whether the first page is successfully read according to whether the data retrieved from the first page has error bits and whether the error bits of the first page can be corrected by the error correction using the parity codes. When the first page does not have error bits, the controller 160 determines that the first page is successfully read. When the first page is successfully read, the process goes to step S528, otherwise, the process goes to step S520.

In step S520, the controller 160 selects a read voltage which has not been used from the read-retry table to set up a read retry voltage.

Next, in step S522, the controller 160 uses the read retry voltage set up in step S520 to read the first page.

Next, in step S524, controller 160 determines whether the first page is successfully read. Namely, the controller 160 determines whether the first page is successfully read according to whether the data retrieved from the first page has error bits and whether the error bits of the first page can be corrected by the error correction using the parity codes. When the first page does not have error bits, the controller 160 determines that the first page is successfully read. When the first page is successfully read, the process goes to step S528, otherwise, the process goes to step S525.

In step S525, the controller 160 determines whether all of the read voltages of the read-retry table have been used to read the first page. When all of the read voltages of the read-retry table have been used to read the first page, the process goes to step S526, otherwise, the process returns to step S520, the controller 160 continues to select another un-used read voltage to set up the read retry voltage.

In step S526, the controller 160 marks the first page as a bad page or marks the first block which includes the first page as a bad block. In one embodiment, the controller 160 can also abandon the data of the first page and move the other data of the block which includes the first page to another block. The process ends at step S526.

In step S528, the controller 160 transmits the data successfully read from the first page in the step S400 to the host 120 according to the read command. The process ends at step S528.

The data storage device 140 and the data maintenance method of the above embodiments can reduce the error bits by closing the word line to successfully read the page.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, comprising a plurality of pages and a plurality of word lines, wherein each of the word lines controls at least two of the pages; and
a controller, reading a first page of the pages in response to a read command, wherein the first page is controlled by a first word line of the word lines, and the controller further writes dummy data into the pages controlled by the first word line other than the first page when a predetermined condition is satisfied, wherein the predetermined condition comprises that the first word line is not close and the first page cannot be successfully read.

2. The data storage device as claimed in claim 1, wherein the controller re-reads the first page after the dummy data is written into the pages controlled by the first word line other than the first page.

3. The data storage device as claimed in claim 2, wherein the controller transmits data obtained by reading the first page to a host according to the read command when the first page is successfully re-read.

4. The data storage device as claimed in claim 1, wherein the controller further repeatedly reads the first page according to a plurality of read voltages of a read-retry table, wherein the predetermined condition further comprises that all of the read voltages cannot successfully read the first page.

5. A data maintenance method, applied to a data storage device having a flash memory, wherein the flash memory comprises a plurality of pages and a plurality of word lines, each of the word lines controls at least two of the pages, and the data maintenance method comprises:

receiving a read command, wherein the read command indicates reading a first page of the pages, and the first page is controlled by a first word line of the word lines; and writing dummy data into the pages controlled by the first word line other than the first page when a predetermined condition is satisfied, wherein the predetermined condition comprises that the first word line is not close and the first page cannot be successfully read.

6. The data maintenance method as claimed in claim 5, further comprising re-reading the first page after the dummy data is written into the pages controlled by the first word line other than the first page.

7. The data maintenance method as claimed in claim 6, further comprising transmitting data obtained by reading the first page to a host according to the read command when the first page is successfully re-read.

8. The data maintenance method as claimed in claim 5, further comprising repeatedly reading the first page according to a plurality of read voltages of a read-retry table, wherein the predetermined condition further comprises that all of the read voltages cannot successfully read the first page.

* * * * *